United States Patent
Dai et al.

(10) Patent No.: US 6,713,328 B2
(45) Date of Patent: Mar. 30, 2004

(54) MANUFACTURING METHOD OF THIN FILM TRANSISTOR PANEL

(75) Inventors: Yuan-Tung Dai, Taoyuan Hsien (TW); Chi-Shen Lee, Hsinchu (TW); Jiun-Jye Chang, Kaochung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/918,511

(22) Filed: Aug. 1, 2001

(65) Prior Publication Data

US 2002/0187572 A1 Dec. 12, 2002

(30) Foreign Application Priority Data

Jun. 7, 2001 (TW) ........................... 90113766 A

(51) Int. Cl.$^7$ ............................................. H01L 21/00
(52) U.S. Cl. .......................... 438/151; 438/29; 438/30; 438/149; 438/152
(58) Field of Search ............................ 438/29, 30, 149, 438/151, 152

(56) References Cited

U.S. PATENT DOCUMENTS

| | | | | |
|---|---|---|---|---|
| 5,705,424 A | * | 1/1998 | Zavracky et al. | 438/30 |
| 5,880,010 A | * | 3/1999 | Davidson | 438/455 |
| 6,022,751 A | * | 2/2000 | Shindo et al. | 438/21 |
| 6,057,557 A | * | 5/2000 | Ichikawa | 257/59 |
| 6,127,199 A | * | 10/2000 | Inoue et al. | 438/30 |
| 6,372,608 B1 | * | 4/2002 | Shimoda et al. | 438/455 |

* cited by examiner

Primary Examiner—John F. Niebling
Assistant Examiner—Stanetta Isaac
(74) Attorney, Agent, or Firm—Birch, Stewart, Kolasch & Birch, LLP

(57) ABSTRACT

A method for manufacturing thin film transistor panels in order to obviate the lowstability of conventional laser annealing processes, and the resultant low quality of the produced polycrystal silicon thin film. According to the method of the invention, form a transparent insulator on the front surface of a silicon substrate. Form a thin film transistor structure and transparent electrode on the upper surface of the transparent insulator. Bond a transparent substrate onto the front surface of the silicon substrate. After that, remove a portion of the silicon substrate by polishing or etching the back of the silicon substrate to obtained a transparent thin film transistor panel. The transparent electrode can also be formed on the bottom surface of the transparent insulator. Also, the transparent substrate can be bonded onto the back of the silicon substrate. Then reduce the thickness of the silicon substrate to generate a crystal silicon thin film. Form a thin film transistor structure layer and the transparent electrode required by the thin film transistor panel on the crystal silicon thin film.

34 Claims, 6 Drawing Sheets

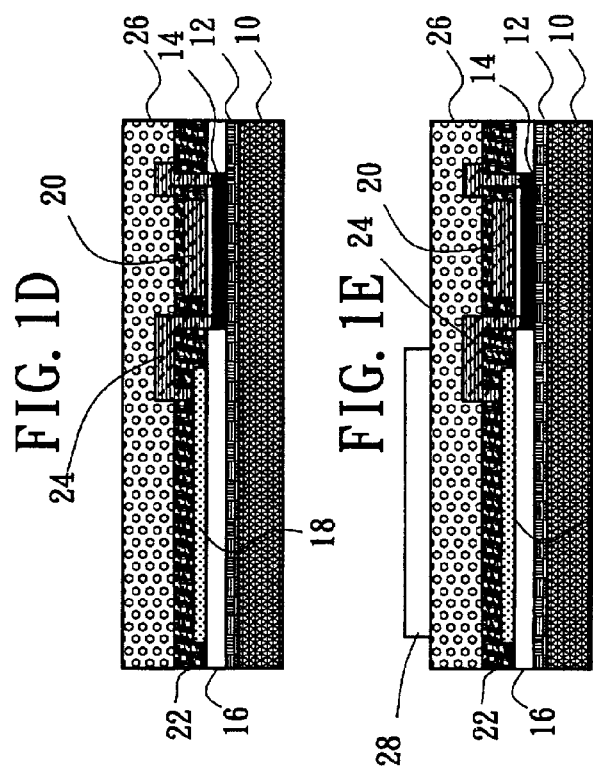
FIG. 1A
FIG. 1B
FIG. 1C
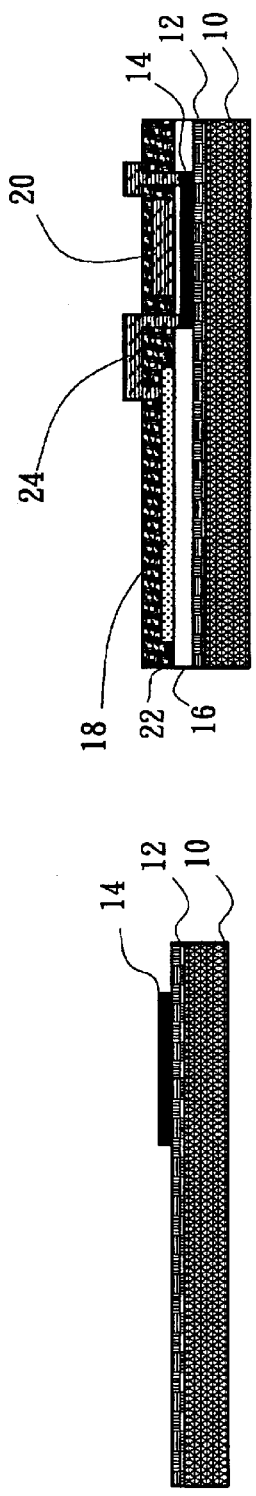
FIG. 1D
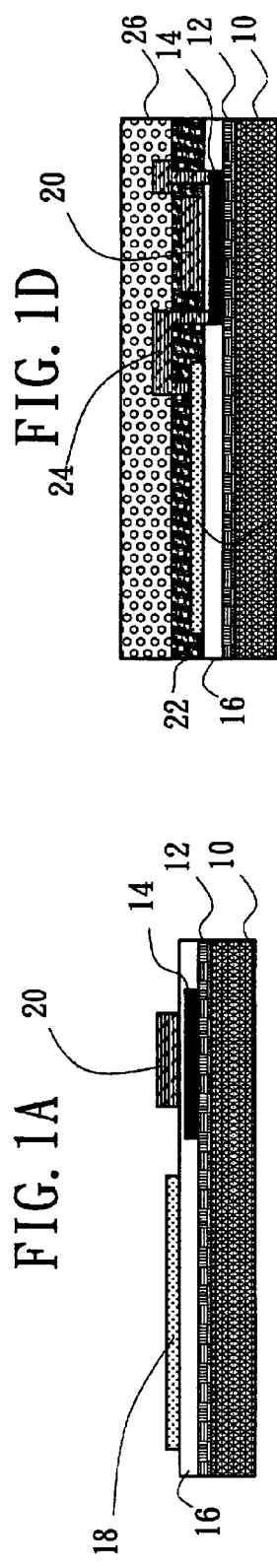
FIG. 1E
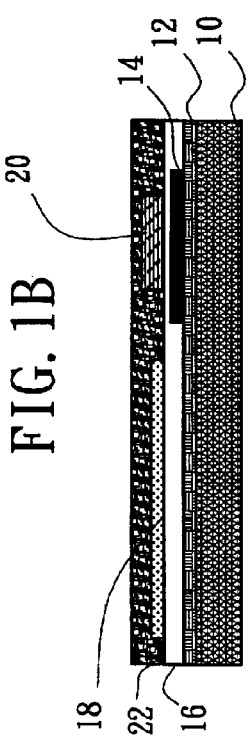
FIG. 1F

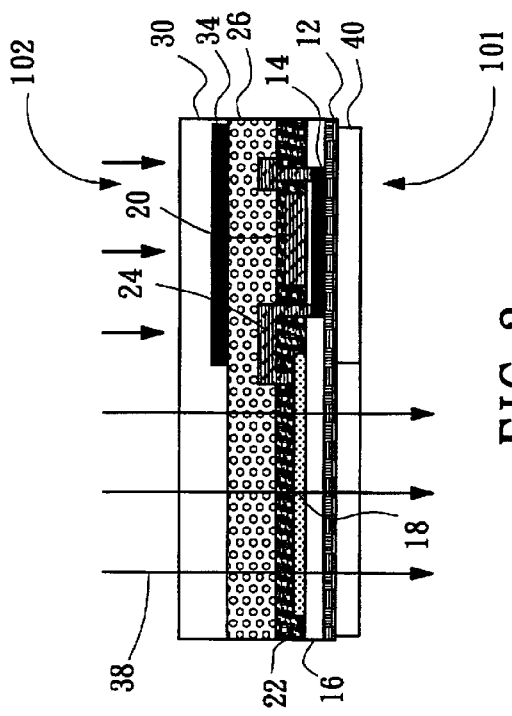
FIG. 3
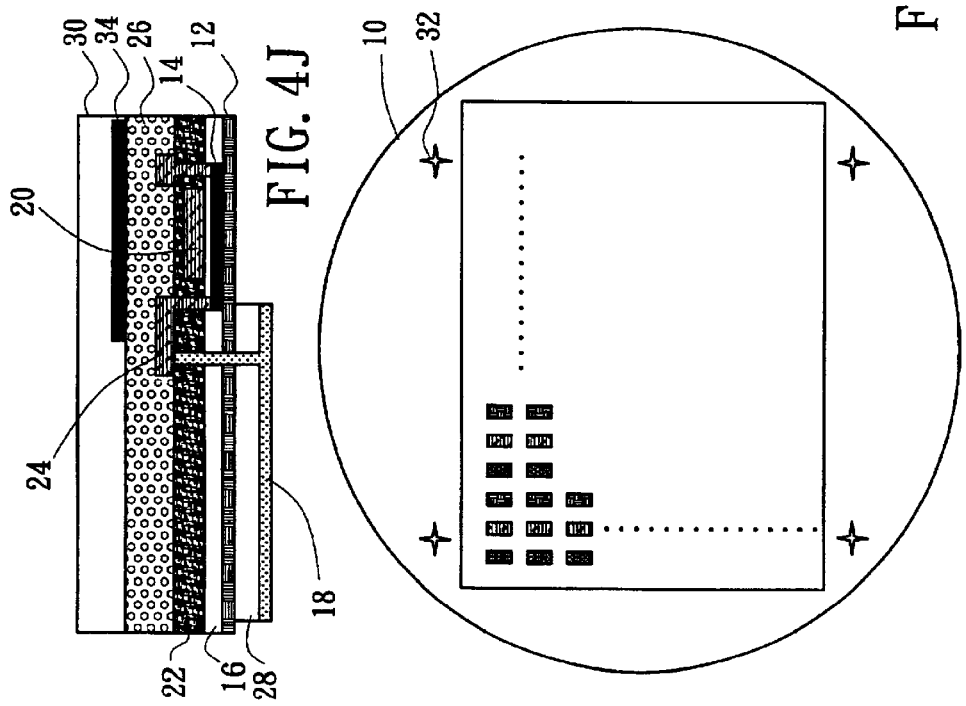
FIG. 4J
FIG. 2

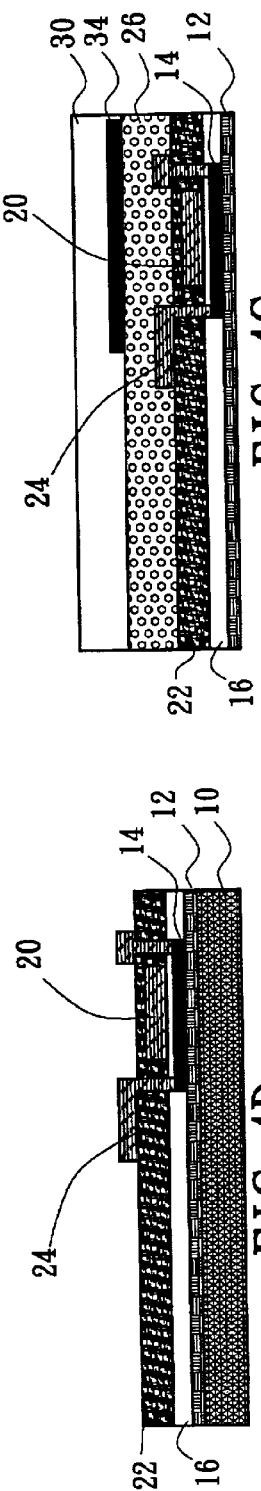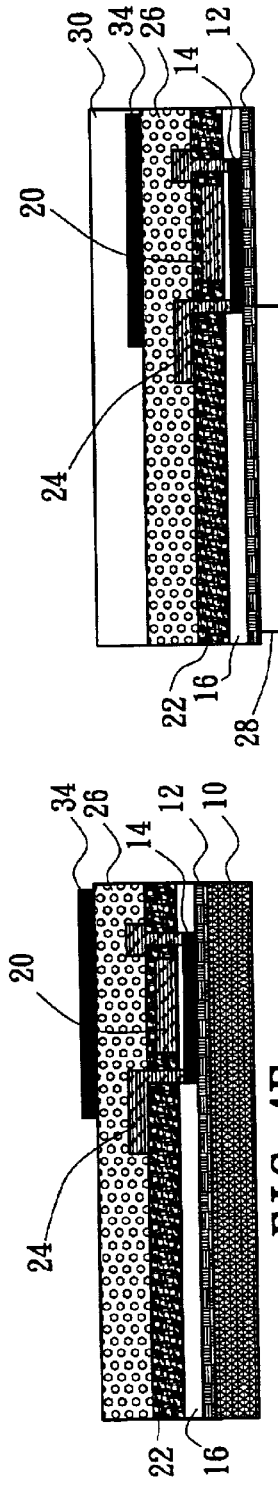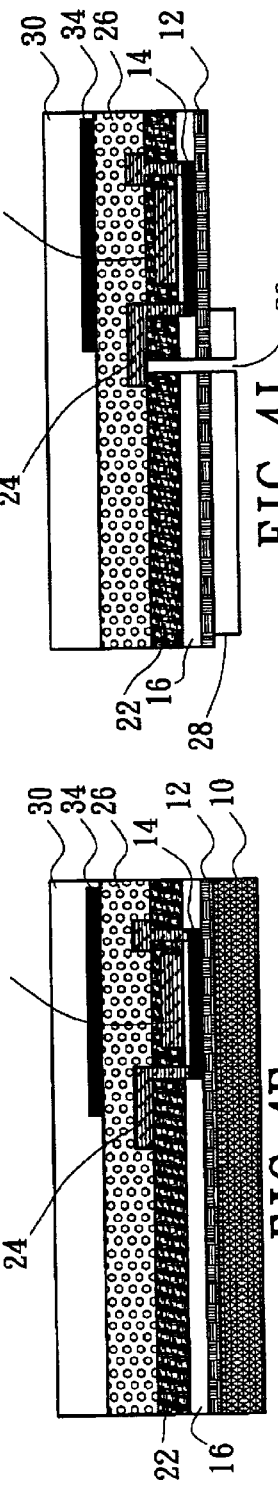

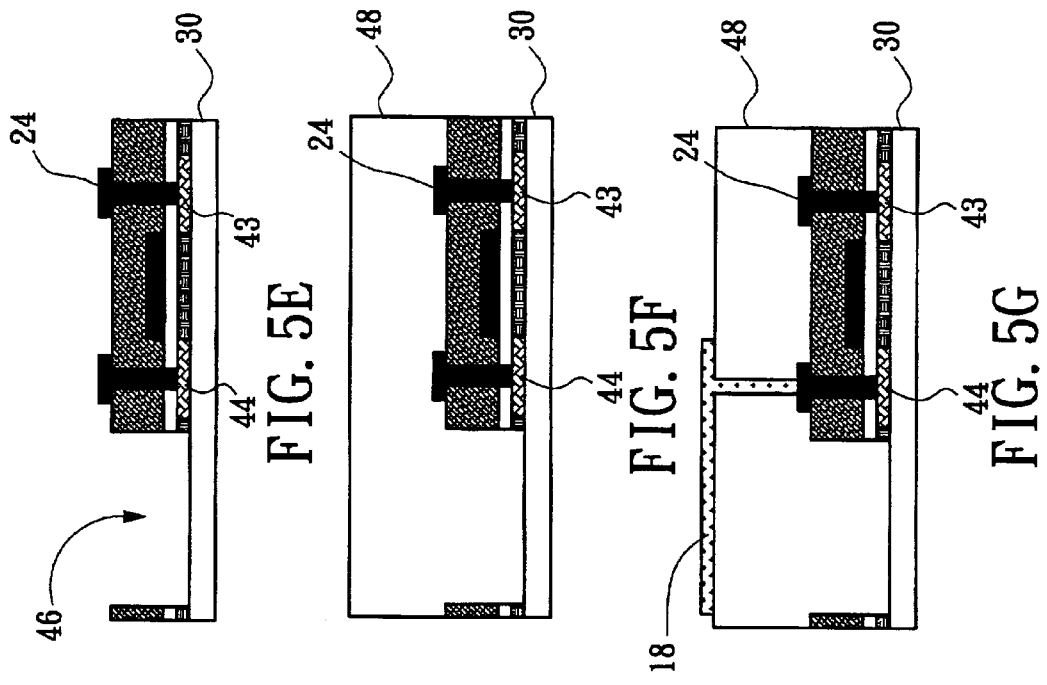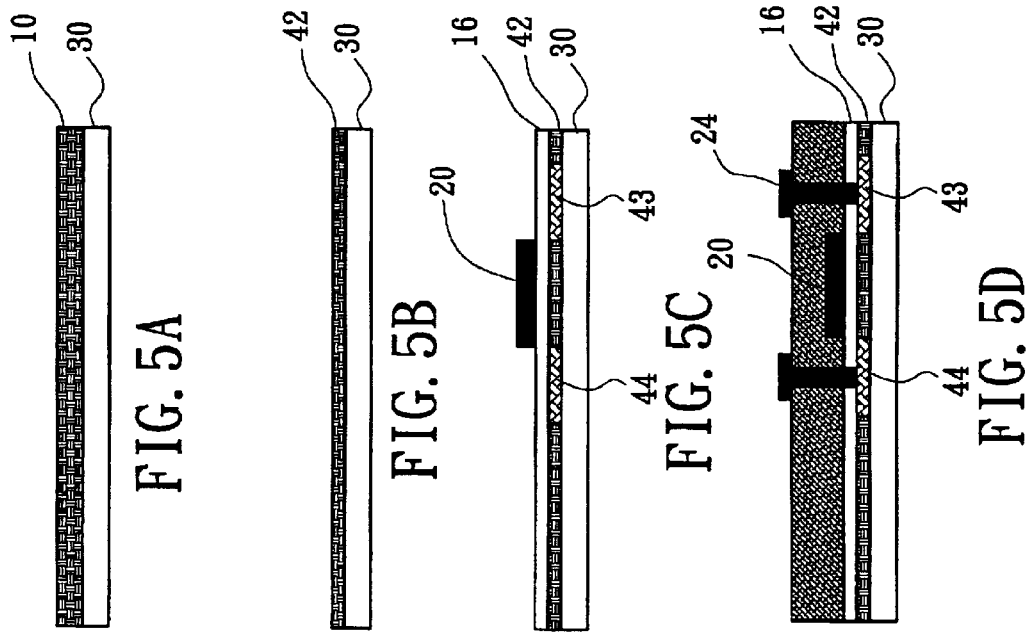

MANUFACTURING METHOD OF THIN FILM TRANSISTOR PANEL

BACKGROUND OF THE INVENTION

1. Field of Invention

The present invention relates to a method for manufacturing liquid crystal display panels, and especially a method for manufacturing thin film transistor (TFT) panels.

2. Related Art

The TFT liquid crystal display panel is a very popular planar display panel with the advantages of small volume, high resolution and low power consumption. It has been widely used in information display devices of various electronic products, such as TVs、computers、cellular phones、personal digital assistants (PDA)、liquid crystal projectors and information appliances (IA). The thin film liquid crystal display panel (TFT-LCD) contains two separated parallel glass panels. Liquid crystal material is filled into the space between the two separated parallel glass panels. An active-matrix driving circuit of thin film transistors is usually formed on one of the separated parallel glass panels. Each of the thin film transistors corresponding to one specific pixel of the liquid crystal display panel is used to turn on/off the pixel. The glass panel with the thin film transistor driving circuit can be called a thin film transistor panel. According to the structural differences of the thin film material, the thin film transistor panel can be classified as an amorphous silicon (a-Si) thin film transistor panel or a polysilicon (p-Si) thin film transistor panel. Due to defects in the amorphous silicon, the mean free path of electrons is influenced and electron mobility is reduced. The electron mobility with polysilicon is one hundred times greater than the electron mobility with amorphous silicon. Therefore, the application of polysilicon thin film transistors on the driving circuit of the display has been accepted by the thin film transistor display industry. FIG. 6 is a cross-sectional view of a polycrystal thin film transistor. The method of manufacturing polycrystal thin film transistors involves forming a layer of polycrystal silicon 2. The polycrystal silicon layer comprises two heavily doped n+ regions 3、4, which are source 5 and drain 6 respectively. One insulator 7 is formed on the glass substrate 1 and the polycrystal layer 2. However, the two heavily doped n+ regions 3、4 are exposed in order to form a contact via connecting the source 5 and drain 6 later. A gate 8 is formed between the two heavily doped n+ regions 3、4, and above the polycrystal silicon layer 2. A gate oxide layer 9 is formed between the gate 8 and the polycrystal silicon layer 2. Conventionally, high temperature processes cannot be used to form a polycrystal layer providing high electron mobility on the glass substrate because the tolerable temperature of the glass substrate 1 is lower than the processing temperature. Laser annealing is a method often used for forming the polycrystal silicon layer 2. The laser annealing process involves forming a layer of amorphous silicon on the glass substrate by chemical vapor deposition. Then the amorphous silicon layer is recrystallized to form a polycrystal silicon layer by excimer laser annealing (ELA). However, excimer laser annealing is not a very stable process. It is also very difficult to form a high quality crystal thin film on an amorphous glass substrate. The polycrystal silicon layer formed by the laser annealing process is thus not very uniform. Its surface is too rough and causes current leakage of the gate oxide. When this happens, the transistor is damaged and the reliability of the thin film transistor panel is negatively affected.

Therefore, It is necessary to have a novel method for manufacturing thin film transistor panels that provides high performance and reliability without the problems mentioned above.

SUMMARY OF THE INVENTION

The purpose of the invention is to provide a novel method for manufacturing thin film transistor panels to overcome the low stability of the conventional laser annealing process and resultant low quality of the polycrystal silicon thin film.

According to purposes mentioned above, the method of the invention for manufacturing thin film transistor panel is to form a transparent insulator on a silicon substrate. Form a thin film transistor structure and transparent electrode on the transparent insulator. A high temperature process can be used to obtain a thin film transistor with high uniformity and high electron mobility. The thin film transistor is, for example, high quality polycrystal silicon thin film. After that, a transparent substrate is bonded onto the surface of the silicon substrate. The back of the silicon substrate is then polished by chemical mechanical polishing, or etched to remove the silicon substrate. A transparent thin film transistor is thus formed by this method. This method comprises the following steps: provide a silicon substrate; form a layer of transparent insulation on the front surface of the silicon substrate; form a plurality of thin film transistor structures and a plurality of corresponding transparent electrodes on the transparent insulator; bond a transparent substrate onto the front surface of the silicon substrate; remove the silicon substrate; and expose the transparent electrode by etching the transparent insulator.

According to the invention, a color filter can also be added into the manufacturing process if necessary. For example, the color filter can be formed on the thin film transistor structure layer. An alignment mark can also be formed on the transparent insulator so as to be exposed from the transparent insulator side (the alignment mark can be seen from the bottom surface side) after the silicon substrate is removed. Therefore, it can be of help if the transparent insulator side undergoes a subsequent photolithographic process.

Before bonding the transparent substrate in the invention, a black matrix can be formed on the thin film transistor structure layer. The black matrix defines the transparent range of pixels on the thin film transistor panel and masks the portion of the thin film transistor panel that is most likely to incur light-leakage problems. The black matrix can also be a photo mask in the step of etching the transparent insulator for exposing the transparent electrode. In this case, a back exposure process is used (expose from the transparent substrate side of the thin film transistor panel). A positive photo-resist on the bottom of the transparent insulator will be exposed without an additional photo mask. A subsequent photolithographic process can be performed to generate a suitable contact via on the transparent insulator. The contact via allows the transparent electrode to be exposed from the transparent insulator side of the thin film transistor panel. Hence, this traditionally complicated process is simplified, and productivity is increased.

According to the invention, the transparent electrode can also be formed on the bottom surface of the transparent insulator. This method comprises the following steps: provide a silicon substrate; form a transparent insulator on the silicon substrate; form a plurality of thin film transistors on the surface of the transparent insulator; bond a transparent substrate onto the front surface of the silicon substrate; remove the silicon substrate; and form a plurality of transparent electrodes corresponding to the thin film transistor structures on the bottom surface of the transparent insulator.

According to method of the invention: A color filter can be formed on the bottom surface of the transparent insulator. A black matrix can be formed on the thin film transistor structure if required.

According to purpose of the invention, another method for manufacturing thin film transistor panels is to bond a transparent substrate onto the back of the silicon substrate, and reduce the thickness of the silicon substrate to form a layer of crystal silicon thin film. Form the required thin film transistor structure layer and transparent electrode on the crystal silicon thin film. This method comprises the following steps: provide a silicon substrate; bond a transparent substrate onto the back of the silicon substrate; reduce the thickness of the silicon substrate to form a layer of crystal silicon thin film; Form a plurality of thin film transistor structures on the crystal silicon thin film; etch the thin film transistor structure layer and the crystal silicon thin film to form suitable pixel via; form a planarization layer on the thin film transistor structure and the pixel via; and form a plurality of transparent electrodes corresponding to the thin film transistor structures on the planarization layer.

The process for reducing the thickness of the silicon substrate can be wafer polishing or etching. The planarization layer can be produced by color filter material. In this case, the planarization layer also provides the function of color filtering.

The method of the invention for manufacturing thin film transistor panels solves the traditional problems of forming thin film transistors on glass substrate and provides advantages such as high stability, high aspect ration and high productivity.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description provided below. However, the following description is for purposes of illustration only, and thus is not limitative of the present invention, wherein:

FIGS. 1A~FIG. 1I illustrate cross-sectional views of processes in the first embodiment of the invention for manufacturing thin film transistor panels.

FIG. 2 illustrates a top view of the silicon substrate according to the invention with an alignment mark formed on the surface.

FIG. 3 illustrates that black matrix can be used as a photo mask. Expose the photo-resist layer on the bottom surface of the transparent insulator by back exposure in order to define the range of the contact via of the transparent insulator.

FIGS. 4A~FIG. 4J illustrate cross-sectional views of processes in the second embodiment of the invention for manufacturing thin film transistor panels.

FIGS. 5A~FIG. 5G illustrate cross-sectional views of processes in the third embodiment of the invention for manufacturing thin film transistor panels.

DETAILED DESCRIPTION OF THE INVENTION

Figure 4A:
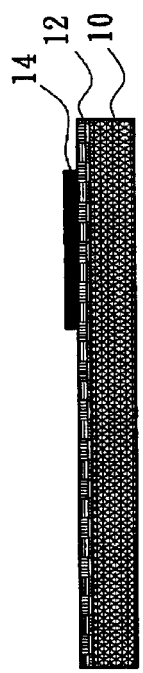

The first embodiment of the invention is illustrated by FIGS. 1A to FIG. 1I, which represent cross-sectional views of processes for manufacturing thin film transistor panels. It should be noted that the invention is illustrated by one thin film transistor structure and one transparent electrode on silicon substrate. Anyone who is familiar with this technique should understand that it is possible for a plurality of thin film transistor structures and a plurality of transparent electrodes to be formed on the silicon substrate by the same manufacturing method.

As illustrated in FIG. 1A, a transparent insulator 12 is formed on the front surface of the silicon substrate 10. The transparent insulator 12 can be a thick film used as buffer layer. The desired thickness of the transparent insulator 12 is less than one micrometer. The material of the transparent insulator 12 can be $SiO_x$、$SiN_x$ or other materials with suitable transparent insulating properties. Subsequently, a patterned transistor thin film 14 is formed on the transparent insulator 12. The transistor thin film 14 is used as a conducting channel for the thin film transistor. The material of the transistor thin film 14 can be polycrystal silicon (p-Si)、polycrstal germanium (p-Ge)、polycrystal silicon germanium (p-SiGe)、crystal silicon (c-Si)、crystal germanium (c-Ge)、crystal silicon germanium (c-SiGe) or other suitable semiconductor materials. The method of the invention is to form a thin film transistor on a silicon substrate, so a high temperature process can be used to obtain a transistor thin film 14 with high uniformity and high electron mobility. A doping process is performed on the transistor thin film 14 to form a suitable source region and drain region. The doping process is well known by those who are familiar with this technique, so it is not described in detail here.

As illustrated in FIG. 1B, form a gate insulator 16 on the transistor thin film 14. Form a transparent electrode 18 and a gate electrode 20 on the gate insulator 16 by a sputtering process. The transparent electrode 18 can be an indium tin oxide (ITO) transparent electrode. The gate electrode 20 can be metal or poly-gate. The transparent electrode 18 can be formed before the gate electrode 20, or the gate electrode 20 can be formed before the transparent electrode 18.

Referring to FIG. 1C, an interlayer 22 is formed on the transparent electrode 18、the gate electrode 20、and the gate insulator 16. As showed in FIG. 1D, photolithographic and etching processes can be performed to create a contact via exposing the transparent electrode 18 and the transistor thin film 14. Form a suitable metal contact layer 24 on the interlayer 22 for conduction between the transparent electrode 18 and the transistor thin film 14, and between the transistor thin film 14 and other external devices. At this point, the thin film transistor structure and its corresponding transparent electrode are formed on the silicon substrate 10.

Referring to FIG. 1E, form a passivation layer 26 on the metal contact layer 24. This passivation layer 26 can be silicon oxide or silicon nitride. A color filter used in color display panels can be applied to the invention. As shown in FIG. 1F, a color filter layer 28 is formed on a portion of the passivation layer 26 corresponding to the transparent electrode 18. The manufacturing process of the invention can also be performed without the color filter layer 28.

Figure 1G:
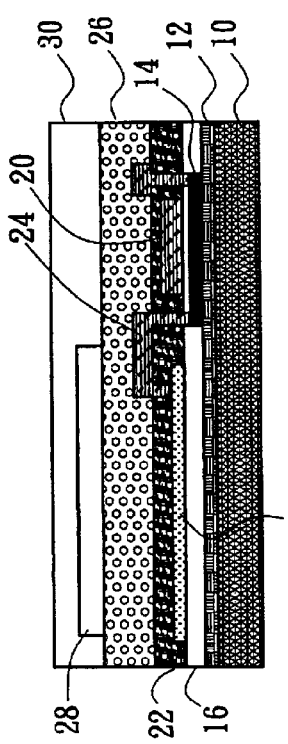

Referring to FIG. 1G, bond a transparent substrate 30 onto the front surface (the side with the transistor) of the silicon substrate. The transparent substrate 30 can be glass substrate, polymer substrate or other suitable transparent material.

Figure 1H:
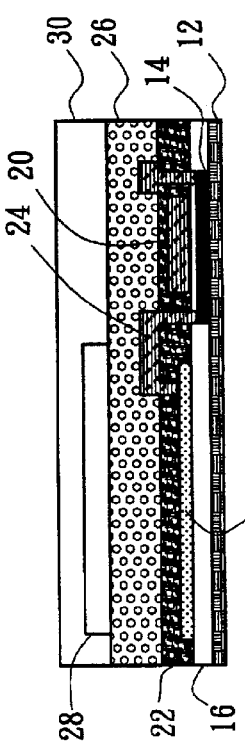

Referring to FIG. 1H, remove the non-transparent silicon substrate 10 from the back surface of the silicon substrate 10 to expose the bottom surface of transparent insulator 12.

Figure 1I:
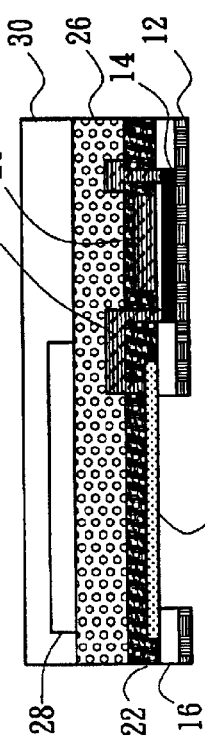
Figure 6:
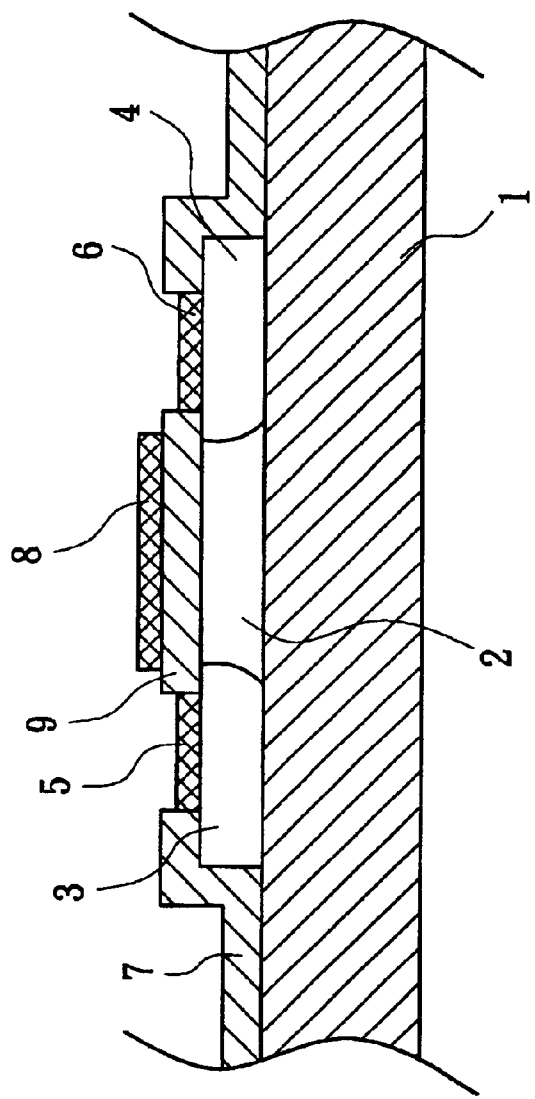
FIG. 6 illustrates a conventional thin film transistor on a glass substrate.

Referring to FIG. 1I, etch away the transparent insulator 12 and the gate insulator 16 to expose the contact via of the transparent electrode 18. After these process mentioned above, the first embodiment of the invention is completed. Light can penetrate through the thin film transistor panel because the non-transparent silicon substrate has been removed.

According to the embodiment of the invention for manufacturing thin film transistor panels, as illustrated in FIG. 1B, an alignment mark can be formed on the silicon substrate (over the gate insulator 16) when the gate electrode 20 is being formed. The top view is shown in FIG. 2. Hence, an alignment mark 32 can be exposed from the transparent insulator 12 side of the thin film transistor panel. Photolithographic processes can then be easily performed on the transparent insulator 12 side of the thin film transistor panel.

According to the invention, these processes can also be performed without the color filter 28. As shown in FIG. 3, form a black matrix 34 on the passivation layer 26 before bonding the transparent substrate 30. The black matrix can be used to define the range of pixels on the thin film transistor where light is able to penetrate, and mask the portion of the thin film transistor panel where light-leakage could possibly occur. The black matrix 34 can be a photo mask in the etching process for exposing the transparent electrode. In this case, a back exposure process is used (light 38 exposure from the transparent substrate side 102 of the thin film transistor panel). The positive photo-resist 40 on the bottom surface of the transparent insulator 12 will be exposed without an additional photo mask. A subsequent photolithographic process can be performed to generate a suitable contact via on the portion of the transparent insulator 12 corresponding to the transparent electrode 18. The contact via allows the transparent insulator side 101 of the thin film transistor panel to be exposed. Hence, traditionally complicated processes are simplified and productivity is increased.

Additionally, according to the method of the invention for manufacturing thin film transistor panels, the transparent electrode layer and the color filter can also be formed on the transparent electrode side of the thin film transistor panel. The black matrix can be applied to the manufacturing process. Refer to FIGS. 4A~FIG. 4J, which show cross-sectional views of another embodiment of the invention.

As illustrated in FIG. 4A, a transparent insulator 12 is formed on the silicon substrate 10. The transparent insulator 12 can be a thick film used as a buffer layer. The material of the transparent insulator 12 can be $SiO_x$、$SiN_x$ or other materials with suitable transparent insulating properties. Subsequently, a patterned transistor thin film 14 is formed on the transparent insulator 12. The transistor thin film 14 is used as a conducting channel for the thin film transistor. The material of the transistor thin film 14 can be polycrystal silicon (p-Si)、polycrstal germanium (p-Ge)、polycrystal silicon germanium (p-SiGe)、crystal silicon (c-Si)、crystal germanium (c-Ge)、crystal silicon germanium (c-SiGe) or other suitable semiconductor materials.

Figure 4B:
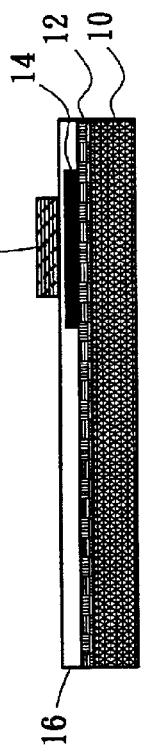

As illustrated in FIG. 4B, form a gate insulator 16 on the transistor thin film 14. Form a gate electrode 20 on the gate insulator 16 by a sputtering process. The gate electrode 20 can be metal or poly-gate.

Figure 4C:
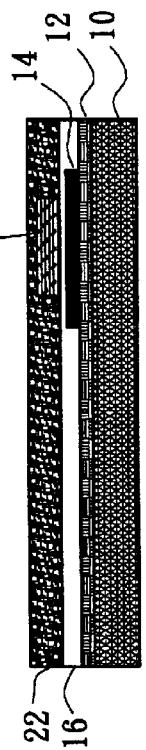

Referring to FIG. 4C, an interlayer 22 is formed on the transparent electrode 18、the gate electrode 20 and the gate insulator 16. As showed in FIG. 4D, photolithographic and etching processes can be performed to obtain a contact via corresponding to the transistor thin film 14. Form a suitable metal contact layer 24 on the interlayer 22 for conduction from the source region and drain region to external devices. At this point, the thin film transistor structure is formed on the silicon substrate 10.

Referring to FIG. 4E, Form a passivation layer 26 on the metal contact layer 24. This passivation layer 26 can be silicon oxide or silicon nitride. Form a patterned black matrix 34 on the passivation layer 26.

As shown in FIG. 4F, bond a transparent substrate 30 onto the front surface (the side with the transistor) of the silicon substrate 10. The transparent substrate 30 can be glass substrate, polymer substrate or other suitable transparent material.

As shown in FIG. 4G, the back of the silicon substrate (the side without the transistor) is then polished by chemical mechanical polishing, or etched to remove the non-transparent silicon substrate.

As shown in FIG. 4H, form a suitable color filter 28 on the bottom surface of the transparent insulator 12 at the transparent insulator side 101 of the thin film transistor panel. Form a contact via 36 of the metal contact layer 24 on the transparent insulator side 101.

Referring to FIG. 4J, a transparent electrode 18 is formed on the color filter 28. The transparent electrode 18 connects with the metal contact layer 24 by the contact via 36, and thus electrically conducts with the transistor thin film 14. The transparent electrode 18 can be an indium tin oxide (ITO) transparent electrode. The manufacturing process can also be performed without the color filter 28 and by forming the transparent electrode 18 on the bottom surface of the transparent insulator 12.

Another embodiment of the invention is to bond a transparent substrate (e.g. glass substrate) onto the back of the silicon substrate. Etch away a certain thickness of the silicon substrate to form a crystal silicon thin film which thickness is reduced to about one micrometer. Then manufacture those thin film transistors and transparent electrodes on the silicon thin film. This process is illustrated by FIGS. 5A~FIG. 5G.

Referring to FIG. 5A, bond a transparent substrate 30 onto the back surface of the silicon substrate 10. The transparent substrate 30 can be glass substrate, polymer substrate or other suitable transparent material. Also, a thick film can be formed on the back of the silicon substrate 10 to act as a buffer layer before bonding the transparent substrate. It is also possible to not include this buffer layer.

After that, as illustrated in FIG. 5B, chemical mechanical polishing or etching processes can be used to reduce the non-transparent silicon substrate 10 to generate a crystal silicon thin film 42. The thickness of the crystal thin film can be controlled while the thickness reduction process is being performed. If the thickness of the crystal silicon thin film 42 is limited to around one micrometer it is helpful for subsequent processes, though the thickness of the crystal silicon thin film 42 need not be limited as such.

As shown in FIG. 5C, form a thin film transistor structure layer on the crystal silicon thin film 40. Firstly, for a suitable source region 43 and drain region 44 (n+ or p+ heavily doped region), form a gate insulator 16 on the crystal silicon thin film 42. Form a suitable gate electrode 20 on the gate insulator 16.

Referring to FIG. 5C, an interlayer 22 is formed on the gate electrode and the gate insulator 16. Photolithographic and etching processes can be performed to obtain a contact via exposing the source region 43 and the drain region 44. Form a suitable metal contact layer 24 on the interlayer 22 for conduction from the source region 43 and drain region 44 to external devices. At this point, the thin film transistor structure is formed on the crystal silicon thin film 42.

Referring to FIG. 5E, etch the interlayer 22、gate insulator 16 and the crystal silicon thin film 42 to obtain a suitable contact via 46.

Referring to FIG. 5F, form a planarization layer 48 to cover the thin film transistor structure and the contact via 46. The planarization layer 48 is used to smooth the surface of the thin film transistor panel and increase reliability of the produced thin film transistor panel. Moreover, the planarization layer 48 is able to filter color if a color filtering material is used as the planarization layer 48.

Referring to FIG. 5G, etch the planarization layer 48 to obtain a contact via for exposing the metal contact layer 24. Form a transparent electrode 18 corresponding to the pixel via 46 on the planarization layer 48. The transparent electrode 18 connects with the metal contact layer 24 by the contact via of the metal contact layer. At this point, this embodiment of the invention for manufacturing thin film transistor panels is completed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a thin film transistor panel, comprising at least the following steps:
   providing a silicon substrate;
   forming a transparent insulator on a front surface of said silicon substrate;
   forming a plurality of thin film transistor structures and a plurality of corresponding transparent electrodes on said transparent insulator;
   forming a black matrix on said plurality of thin film transistor structures;
   bonding a transparent substrate onto the front surface of said silicon substrate;
   removing said silicon substrate by chemical mechanical polishing or an etching process; and
   etching said transparent insulator to expose said plurality of corresponding transparent electrodes.

2. A method for manufacturing a thin film transistor panel of claim 1, wherein said transparent insulator is $SiO_x$.

3. A method for manufacturing a thin film transistor panel of claim 1, wherein said transparent insulator is $SiN_x$.

4. A method for manufacturing a thin film transistor panel of claim 1, wherein the thickness of said transparent insulator is less than 1 micrometer.

5. A method for manufacturing a thin film transistor panel of claim 1, wherein said transparent electrode is made of indium tin oxide.

6. A method for manufacturing a thin film transistor panel of claim 1, wherein said transparent substrate is a glass substrate.

7. A method for manufacturing a thin film transistor panel of claim 1, wherein said transparent substrate is a polymer substrate.

8. A method for manufacturing a thin film transistor panel of claim 1, wherein said silicon substrate is non-transparent.

9. A method for manufacturing a thin film transistor panel of claim 1, further comprising forming metal contacts after said plurality of transparent electrodes are formed.

10. A method for manufacturing a thin film transistor panel of claim 1, further comprising forming an alignment mark on said transparent insulator.

11. A method for manufacturing a thin film transistor panel of claim 1, wherein the step of forming said plurality of thin film transistor structures and said plurality of corresponding transparent electrodes further comprises:
    forming a transistor thin film on said transparent insulator;
    forming a gate insulator covering said transistor thin film and said transparent insulator;
    forming a gate electrode on said gate insulator corresponding to a position of said transistor thin film;
    forming a transparent electrode on said gate insulator;
    forming an interlayer on said gate electrode, said transparent electrode, and said gate insulator;
    forming a metal contact layer on said interlayer for conduction between the transparent electrode and the transparent thin film; and
    forming a passivation layer on said metal contact layer.

12. A method for manufacturing a thin film transistor panel of claim 11, wherein the transistor thin film is selected from the group consisting of polycrystal silicon(p-Si), polycrystal germanium (p-Ge), polycrystal silicon germanium (p-SiGe), crystal silicon (c-Si), crystal germanium (c-Ge), and crystal silicon germanium (c-SiGe).

13. A method for manufacturing a thin film transistor panel of claim 11, further comprising forming a color filter on said passivation layer.

14. A method for manufacturing a thin film transistor panel, comprising at least the following steps:
    providing a silicon substrate;
    forming a transparent insulator on a front surface of said silicon substrate;
    forming a plurality of thin film transistor structures on said transparent insulator;
    bonding a transparent substrate onto the front surface of said silicon substrate;
    removing said silicon substrate by chemical mechanical polishing or an etching process; and
    forming a plurality of transparent electrodes corresponding to said plurality of thin film transistor structures on a bottom surface of said transparent insulator.

15. A method for forming a thin film transistor panel of claim 14, wherein said transparent insulator is $SiO_x$.

16. A method for manufacturing a thin film transistor panel of claim 14, wherein said transparent insulator is $SiN_x$.

17. A method for manufacturing a thin film transistor panel of claim 14, wherein the thickness of said transparent insulator is less than 1 micrometer.

18. A method for manufacturing a thin film transistor panel of claim 14, wherein said transparent electrode is made of indium tin oxide.

19. A method for manufacturing a thin film transistor panel of claim 14, wherein said transparent substrate is a glass substrate.

20. A method for manufacturing a thin film transistor panel of claim 14, wherein said transparent substrate is a polymer substrate.

21. A method for manufacturing a thin film transistor panel of claim 14, wherein said silicon substrate is non-transparent.

22. A method for manufacturing a thin film transistor panel of claim 14, further comprising forming an alignment mark on said transparent insulator.

23. A method for manufacturing a thin film transistor panel of claim 14, further comprising forming a black matrix on said plurality of thin film transistor structures before bonding said transparent substrate onto the front surface of said silicon substrate.

24. A method for manufacturing a thin film transistor panel of claim 14, wherein the step of forming said plurality of thin film transistor structures and said plurality of corresponding transparent electrodes further comprises:

forming a transistor thin film on said front surface of said transparent insulator;

forming a gate insulator covering said transistor thin film and said plurality of transparent electrodes;

forming a gate electrode on said gate insulator corresponding to a position of said transistor thin film;

forming an interlayer on said gate electrode and said gate insulator;

forming a metal contact layer on said interlayer; and forming a passivation layer on said metal contact layer.

25. A method for manufacturing a thin film transistor panel of claim 24, wherein said transistor thin film is selected from the group consisting of polycrystal silicon(p-Si), polycrystal germanium (p-Ge), polycrystal silicon germanium (p-SiGe), crystal silicon (c-Si), crystal germanium (c-Ge), and crystal silicon germanium (c-SiGe).

26. A method for manufacturing a thin film transistor panel of claim 14, further comprising forming a color filter on the bottom surface of said transparent insulator before forming said transparent electrode.

27. A method for manufacturing thin film transistor panel, comprising at least the following steps:

providing a silicon substrate;

bonding a transparent substrate onto a back surface of said silicon substrate;

reducing the thickness of said silicon substrate to form a layer of crystal silicon thin film;

forming a plurality of thin film transistor structures on said crystal silicon thin film;

etching said thin film transistor structures and said crystal silicon thin film to form a suitable pixel via;

forming a planarization layer on said thin film transistor structures and said pixel via; and forming a plurality of transparent electrodes corresponding to the thin film transistor structures on said planarization layer, wherein the step of forming said thin film transistor structures further comprises:

forming a source region and a drain region on said crystal silicon thin film;

forming a gate insulator on said crystal silicon thin film;

forming a gate electrode on said gate insulator;

forming an interlayer on said gate electrode and said gate insulator; and forming a metal contact layer on said interlayer.

28. A method for manufacturing a thin film transistor panel of claim 27, wherein the thickness of said transparent insulator is less than 1 micrometer.

29. A method for manufacturing a thin film transistor panel of claim 27, wherein said transparent electrode is made of indium tin oxide.

30. A method for manufacturing a thin film transistor panel of claim 27, wherein said transparent substrate is a glass substrate.

31. A method for manufacturing a thin film transistor panel of claim 27, wherein said transparent substrate is a polymer substrate.

32. A method for manufacturing a thin film transistor panel of claim 27, wherein the step of removing said silicon substrate includes chemical mechanical polishing.

33. A method for manufacturing a thin film transistor panel of claim 27, wherein the step of removing said silicon substrate includes an etching process.

34. A method for manufacturing a thin film transistor panel of claim 27, wherein the planarization layer is also a color filter.

* * * * *